(12) United States Patent
Tamori et al.

(10) Patent No.: US 10,896,668 B2
(45) Date of Patent: Jan. 19, 2021

(54) SIGNAL PROCESSING APPARATUS, SIGNAL PROCESSING METHOD, AND COMPUTER PROGRAM

(71) Applicant: Sony Corporation, Tokyo (JP)

(72) Inventors: Yoshinori Tamori, Tokyo (JP); Kohei Asada, Kanagawa (JP); Tetsunori Itabashi, Kanagawa (JP); Shinpei Tsuchiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/480,381

(22) PCT Filed: Dec. 11, 2017

(86) PCT No.: PCT/JP2017/044374
§ 371 (c)(1),
(2) Date: Jul. 24, 2019

(87) PCT Pub. No.: WO2018/142770
PCT Pub. Date: Aug. 9, 2018

(65) Prior Publication Data
US 2019/0385585 A1    Dec. 19, 2019

(30) Foreign Application Priority Data

Jan. 31, 2017    (JP) ................. 2017-015807

(51) Int. Cl.
*G10K 11/178*    (2006.01)

(52) U.S. Cl.
CPC .. *G10K 11/17853* (2018.01); *G10K 11/17823* (2018.01); *G10K 11/17873* (2018.01);
(Continued)

(58) Field of Classification Search
CPC ....... G10K 11/17853; G10K 11/17823; G10K 11/17873; G10K 2210/3027; G10K 2210/3028
(Continued)

(56) References Cited

U.S. PATENT DOCUMENTS

| 5,592,559 A | 1/1997 | Takahashi et al. |
| 6,608,903 B1 | 8/2003 | Miyazaki et al. |

(Continued)

FOREIGN PATENT DOCUMENTS

| EP | 0335468 A1 | 10/1989 |
| EP | 0735796 A2 | 10/1996 |

(Continued)

OTHER PUBLICATIONS

International Search Report and English translation thereof dated Feb. 13, 2018 in connection with International Application No. PCT/JP2017/044374.

(Continued)

*Primary Examiner* — David L Ton
(74) *Attorney, Agent, or Firm* — Wolf, Greenfield & Sacks, P.C.

(57) ABSTRACT

A signal processing apparatus is provided which can suppress external noise without degrading an audio characteristic.

Provided is a signal processing apparatus including: an A/D converter configured to output a digital signal having a predetermined sampling frequency and quantization bit number a, the A/D converter including a first delta sigma modulator that performs a first delta sigma modulation process on an input analog signal; a filter unit configured to pass an output of the A/D converter through a digital filter provided with a predetermined filter characteristic and output a digital signal having the sampling frequency and a (Continued)

quantization bit number b; a second delta sigma modulator configured to perform a second delta sigma modulation process on an output of the filter unit and output a digital signal having the sampling frequency and the quantization bit number a; and an addition unit configured to add an output of the second delta sigma modulator and an input digital signal having the sampling frequency and the quantization bit number.

20 Claims, 5 Drawing Sheets

(52) U.S. Cl.
CPC .............. *G10K 2210/1081* (2013.01); *G10K 2210/3027* (2013.01); *G10K 2210/3028* (2013.01)

(58) Field of Classification Search
USPC .................................................. 381/74, 71.6
See application file for complete search history.

(56) References Cited

U.S. PATENT DOCUMENTS

| | | | |
|---|---|---|---|
| 7,233,673 B1 | 6/2007 | Poletti | |
| 8,094,046 B2* | 1/2012 | Asada | G10K 11/178 341/61 |
| 8,165,312 B2* | 4/2012 | Clemow | G10K 11/178 381/71.6 |
| 8,848,935 B1* | 9/2014 | Massie | H04R 1/1083 381/71.1 |
| 8,953,813 B2* | 2/2015 | Loeda | G10K 11/178 381/71.11 |
| 9,602,916 B2 | 3/2017 | Asada | |
| 10,175,931 B2 | 1/2019 | Asada et al. | |
| 2006/0109988 A1 | 5/2006 | Metcalf | |
| 2007/0025560 A1 | 2/2007 | Asada | |
| 2008/0056517 A1 | 3/2008 | Algazi et al. | |
| 2008/0186218 A1 | 8/2008 | Ohkuri et al. | |
| 2009/0010443 A1 | 1/2009 | Ahnert et al. | |
| 2010/0027805 A1 | 2/2010 | Itou et al. | |
| 2010/0150359 A1 | 6/2010 | KnicKrehm et al. | |
| 2010/0260345 A1 | 10/2010 | Shridhar et al. | |
| 2012/0093320 A1 | 4/2012 | Flaks et al. | |
| 2012/0155666 A1* | 6/2012 | Nair | G10K 11/178 381/71.6 |
| 2012/0155667 A1* | 6/2012 | Nair | G10K 11/178 381/71.6 |
| 2012/0307048 A1 | 12/2012 | Abrahamsson et al. | |
| 2013/0272548 A1 | 10/2013 | Visser et al. | |
| 2014/0098964 A1 | 4/2014 | Rosca et al. | |
| 2014/0126758 A1 | 5/2014 | Van Der Wijst | |
| 2015/0043756 A1 | 2/2015 | Ojanpera | |
| 2015/0124167 A1 | 5/2015 | Arrasvuori et al. | |
| 2015/0286463 A1 | 10/2015 | Asada et al. | |
| 2015/0296290 A1 | 10/2015 | Asada | |
| 2019/0114136 A1 | 4/2019 | Asada et al. | |

FOREIGN PATENT DOCUMENTS

| | | |
|---|---|---|
| EP | 0989543 A2 | 3/2000 |
| EP | 1970901 A2 | 9/2008 |
| EP | 2239728 A2 | 10/2010 |
| EP | 2879402 A1 | 6/2015 |
| JP | 2000-099061 A | 4/2000 |
| JP | 2003-323179 A | 11/2003 |
| JP | 2006-085214 A | 3/2006 |
| JP | 2007-124023 A | 5/2007 |
| JP | 2008-193421 A | 8/2008 |
| JP | 2008-227773 A | 9/2008 |
| JP | 2008-250270 A | 10/2008 |
| JP | 2009-033309 A | 2/2009 |
| JP | 2010-244045 A | 10/2010 |
| JP | 4674505 B2 | 4/2011 |
| JP | 2011-138151 A | 7/2011 |
| JP | 4725234 B2 | 7/2011 |
| JP | 4735108 B2 | 7/2011 |
| JP | 4775487 B2 | 9/2011 |
| JP | 4883197 B2 | 2/2012 |

OTHER PUBLICATIONS

U.S. Appl. No. 14/437,884, filed Apr. 23, 20215, Asada.
U.S. Appl. No. 14/438,437, filed Apr. 24, 2015, Asada et al.
U.S. Appl. No. 16/201,794, filed Nov. 27, 2018, Asada et al.
International Search Report and Written Opinion and English translation thereof dated Oct. 18, 2013 in connection with Application No. PCT/JP2013/074734.
International Preliminary Report on Patentability and English translation thereof dated May 14, 2015 in connection with Application No. PCT/JP2013/074734.
International Search Report and Written Opinion and English translation thereof dated Oct. 8, 2013 in connection with Application No. PCT/JP2013/074744.
International Preliminary Report on Patentability and English translation thereof dated May 14, 2015 in connection with Application No. PCT/JP2013/074744.
Extended European Search Report dated Jun. 3, 2016 in connection with European Application No. 13852010.1.
Partial Supplementary European Search Report dated Jun. 14, 2016 in connection with European Application No. 13850571.4.
Extended European Search Report dated Sep. 16, 2016 in connection with European Application No. 13850571.4.
Japanese Office Action dated May 16, 2017 in connection with Japanese Application No. 2014-544375 and English translation thereof.
European Communication pursuant to Article 94(3) EPC dated Jan. 30, 2019 in connection with European Application No. 13852010.1.
European Summons to attend oral proceedings pursuant to Rule 115(1) EPC dated Oct. 17, 2019 in connection with European Application No. 13852010.1.
Written Opinion and English translation thereof dated Feb. 13, 2018 in connection with International Application No. PCT/JP2017/044374.
International Preliminary Report on Patentability and English translation thereof dated Aug. 15, 2019 in connection with International Application No. PCT/JP2017/044374.
Extended European Search Report dated Jan. 17, 2020 in connection with European Application No. 17894910.3.

* cited by examiner

SIGNAL PROCESSING APPARATUS, SIGNAL PROCESSING METHOD, AND COMPUTER PROGRAM

CROSS-REFERENCE TO RELATED APPLICATIONS

This application claims the benefit under 35 U.S.C. § 371 as a U.S. National Stage Entry of International Application No. PCT/JP2017/044374, filed in the Japanese Patent Office as a Receiving Office on Dec. 11, 2017, which claims priority to Japanese Patent Application Number JP 2017-015807, filed in the Japanese Patent Office on Jan. 31, 2017, each of which is hereby incorporated by reference in its entirety.

TECHNICAL FIELD

The present disclosure relates to a signal processing apparatus, a signal processing method, and a computer program.

BACKGROUND ART

A noise canceling system has been put into practical use to suppress external noise and enhance a sound insulation effect in a case where a listener listens to audio content with an audio reproduction device such as headphones and earphones. A general noise canceling system generates a signal that cancels noise collected by a noise detection microphone and adds the signal to an audio signal to suppress external noise (See Patent Documents 1, 2, and the like).

CITATION LIST

Patent Documents

Patent Document 1: Japanese Patent Application Laid-Open No. 2008-193421
Patent Document 2: Japanese Patent Application Laid-Open No. 2009-33309

SUMMARY OF THE INVENTION

Problems to be Solved by the Invention

In a case where an audio signal in a direct stream digital (DSD) system having a sampling frequency of megahertz (for example, 2.8 MHz) and a quantization bit number of one is used as an audio signal in an existing noise canceling system, the addition of quantization noise causes degradation of the audio characteristic.

Thus, the present disclosure proposes a signal processing apparatus, a signal processing method, and a computer program that are new and improved and can suppress external noise without degrading an audio characteristic.

Solutions to Problems

The present disclosure provides a signal processing apparatus including: an A/D converter configured to output a digital signal having a predetermined sampling frequency and quantization bit number a, the A/D converter including a first delta sigma modulator that performs a first delta sigma modulation process on an input analog signal; a filter unit configured to pass an output of the A/D converter through a digital filter provided with a predetermined filter characteristic and output a digital signal having the sampling frequency and a quantization bit number b; a second delta sigma modulator configured to perform a second delta sigma modulation process on an output of the filter unit and output a digital signal having the sampling frequency and the quantization bit number a; and an addition unit configured to add an output of the second delta sigma modulator and an input digital signal having the sampling frequency and the quantization bit number a.

Furthermore, the present disclosure provides a signal processing apparatus including: an A/D converter configured to output a digital signal having a predetermined sampling frequency and a quantization bit number a, the A/D converter including a first delta sigma modulator that performs a first delta sigma modulation process on an input analog signal; a filter unit configured to pass an output of the A/D converter through a digital filter provided with a predetermined filter characteristic and output a digital signal having the sampling frequency and a quantization bit number b; a second delta sigma modulator configured to perform a second delta sigma modulation process on an output of the filter unit and output a digital signal having the sampling frequency and the quantization bit number a; a first bit expander configured to expand the quantization bit number from a to c for an output of the second delta sigma modulator; and a first addition unit configured to add an output of the first bit expander and an input digital signal having the sampling frequency and a quantization bit number c.

Further, the present disclosure provides a signal processing apparatus including: a first delta sigma modulation unit configured to perform a first delta sigma modulation process on an input analog signal, generate a digital signal having a predetermined sampling frequency and a quantization bit number a, and output the digital signal after expanding its quantization bit number from a to c; a first equalizer unit configured to generate a first equalized signal by equalizing an input digital signal having the sampling frequency and a quantization bit number c with a first target characteristic, perform a delta sigma modulation process on the first equalized signal, generate a digital signal having the predetermined sampling frequency and the quantization bit number a, and output the digital signal after expanding its quantization bit number from a to c; a second equalizer unit configured to generate a second equalized signal by equalizing an input digital signal having the sampling frequency and the quantization bit number c with a second target characteristic, perform the delta sigma modulation process on the second equalized signal, generate a digital signal having the predetermined sampling frequency and the quantization bit number a, and output the digital signal after expanding its quantization bit number from a to c; a delay unit configured to provide the input digital signal with a delay equivalent to processing delay in the first equalizer unit or the second equalizer unit, and output the signal after expanding its quantization bit number from a to c; a first addition unit configured to add outputs of the first delta sigma modulation unit, the delay unit, and the first equalizer unit; a filter unit configured to pass an output of the first addition unit through a digital filter provided with a predetermined filter characteristic and output a digital signal having the sampling frequency and a quantization bit number b; a second delta sigma modulation unit configured to perform a delta sigma modulation process on an output of the filter unit, generate a digital signal having the sampling frequency and the quantization bit number a, and output the digital signal after expanding its quantization bit number from a to c; and a second addition unit configured to add outputs of the second delta sigma modulation unit, the delay unit, and the second equalizer unit.

Furthermore, the present disclosure provides a signal processing method including: outputting a digital signal having a predetermined sampling frequency and a quantization bit number a by performing a first delta sigma modulation process on an input analog signal; passing a digital signal having the predetermined sampling frequency and the quantization bit number a through a digital filter provided with a predetermined filter characteristic and outputting a digital signal having the sampling frequency and a quantization bit number b; outputting a digital signal having the sampling frequency and the quantization bit number a by performing a second delta sigma modulation process on the digital signal having the quantization bit number b; and adding an output of the second delta sigma modulation process and an input digital signal having the sampling frequency and the quantization bit number a.

Further, the present disclosure provides a signal processing method including: outputting a digital signal having a predetermined sampling frequency and a quantization bit number a by performing a first delta sigma modulation process on an input analog signal; passing a digital signal having the predetermined sampling frequency and the quantization bit number a through a digital filter provided with a predetermined filter characteristic and outputting a digital signal having the sampling frequency and a quantization bit number b; outputting a digital signal having the sampling frequency and the quantization bit number a by performing a second delta sigma modulation process on an output of the digital signal having the sampling frequency and the quantization bit number b; expanding the quantization bit number from a to c for an output of the second delta sigma modulation process; and adding the digital signal having an expanded quantization bit number c and an input digital signal having the sampling frequency and a quantization bit number c.

Furthermore, the present disclosure provides a signal processing method including: performing a first delta sigma modulation process where a digital signal having a predetermined sampling frequency and a quantization bit number a is generated by performing a delta sigma modulation process on an input analog signal, and the digital signal is output after expanding its quantization bit number from a to c; performing a first equalization process where a first equalized signal is generated by equalizing an input digital signal having the sampling frequency and a quantization bit number c with a first target characteristic, a delta sigma modulation process is performed on the first equalized signal, a digital signal having the predetermined sampling frequency and the quantization bit number a is generated, and the digital signal is output after expanding its quantization bit number from a to c; performing a second equalization process where a second equalized signal is generated by equalizing an input digital signal having the sampling frequency and a quantization bit number c with a second target characteristic, a delta sigma modulation process is performed on the second equalized signal, a digital signal having the predetermined sampling frequency and the quantization bit number a is generated, and the digital signal is output after expanding its quantization bit number from a to c; performing a delay process where the input digital signal is provided with a delay equivalent to processing delay in the first equalization process or the second equalization process, and the signal is output after expanding its quantization bit number from a to c; performing a first addition process where outputs of the first delta sigma modulation process, the delay process, and the first equalization process; performing a filter process where an output of the first addition process is passed through a digital filter provided with a predetermined filter characteristic and, a digital signal having the sampling frequency and a quantization bit number b is output; performing a second delta sigma modulation process where a digital signal having the sampling frequency and the quantization bit number a is generated by performing a delta sigma modulation process on an output of the filter process and the digital signal is output after expanding its quantization bit number from a to c; and performing a first addition process where outputs of the second delta sigma modulation process, the delay process, and the second equalization process.

Furthermore, the present disclosure provides a computer program that causes a computer to execute: outputting a digital signal having a predetermined sampling frequency and a quantization bit number a by performing a first delta sigma modulation process on an input analog signal; passing a digital signal having the predetermined sampling frequency and the quantization bit number a through a digital filter provided with a predetermined filter characteristic and outputting a digital signal having the sampling frequency and a quantization bit number b; outputting a digital signal having the sampling frequency and the quantization bit number a by performing a second delta sigma modulation process on the digital signal having the quantization bit number b; and adding an output of the second delta sigma modulation process and an input digital signal having the sampling frequency and the quantization bit number a.

Furthermore, the present disclosure provides a computer program that causes a computer to execute: outputting a digital signal having a predetermined sampling frequency and a quantization bit number a by performing a first delta sigma modulation process on an input analog signal; passing a digital signal having the predetermined sampling frequency and the quantization bit number a through a digital filter provided with a predetermined filter characteristic and outputting a digital signal having the sampling frequency and a quantization bit number b; outputting a digital signal having the sampling frequency and the quantization bit number a by performing a second delta sigma modulation process on an output of the digital signal having the sampling frequency and the quantization bit number b; expanding the quantization bit number from a to c for an output of the second delta sigma modulation process; and adding the digital signal having an expanded quantization bit number c and an input digital signal having the sampling frequency and a quantization bit number c.

Furthermore, the present disclosure provides a computer program that causes a computer to execute: performing a first delta sigma modulation process where a digital signal having a predetermined sampling frequency and a quantization bit number a is generated by performing a delta sigma modulation process on an input analog signal, and the digital signal is output after expanding its quantization bit number from a to c; performing a first equalization process where a first equalized signal is generated by equalizing an input digital signal having the sampling frequency and a quantization bit number c with a first target characteristic, a delta sigma modulation process is performed on the first equalized signal, a digital signal having the predetermined sampling frequency and the quantization bit number a is generated, and the digital signal is output after expanding its quantization bit number from a to c; performing a second equalization process where a second equalized signal is generated by equalizing an input digital signal having the sampling frequency and a quantization bit number c with a second target characteristic, a delta sigma modulation process is performed on the second equalized signal, a digital signal having the predetermined sampling frequency and the quantization bit number a is generated, and the digital signal is output after expanding its quantization bit number from a to c; performing a delay process where the input digital signal is provided with a delay equivalent to processing delay in the first equalization process or the second equalization process, and the signal is output after expanding its quantization bit number from a to c; performing a first addition process where outputs of the first delta sigma modulation process, the delay process, and the first equalization process; performing a filter process where an output of the first addition process is passed through a digital filter provided with a predetermined filter characteristic, and a digital signal having the sampling frequency and a quantization bit number b is output; performing a second delta sigma modulation process where a digital signal having the sampling frequency and the quantization bit number a is generated by performing a delta sigma modulation process on an output of the filter process and the digital signal is output after expanding its quantization bit number from a to c; and performing a first addition process where outputs of the second delta sigma modulation process, the delay process, and the second equalization process.

Effects of the Invention

As described above, according to the present disclosure, a signal processing apparatus, a signal processing method, and a computer program which are new and improved and can suppress external noise without degrading an audio characteristic.

Here, the above described effect should not be limited, and there may be any one of the effects described in this specification or other effects that can be generated based on the present specification in addition to the above mentioned effects, together with the above mentioned effects, or as a substitute for the above mentioned effects.

MODE FOR CARRYING OUT THE INVENTION

Figure 1:
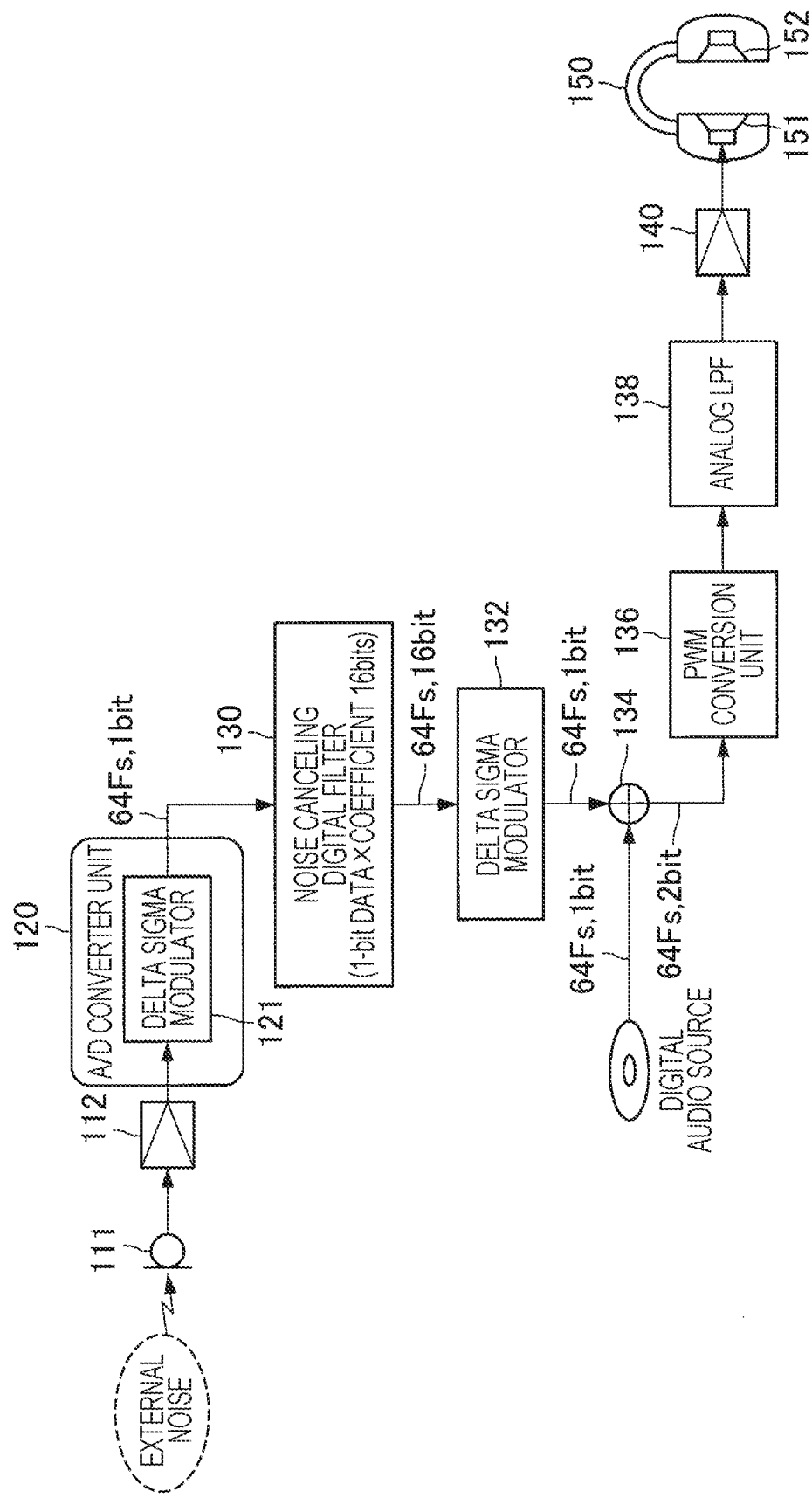
FIG. 1 is a diagram illustrating a configuration example of a noise canceling system according to a first embodiment of the present disclosure.

Preferred embodiments of the present disclosure will be described in detail below with reference to the accompanying drawings. Here, in the present specification and the drawings, same reference numerals are given to constituent elements having substantially same functional configuration, and redundant explanation will be omitted.

Note that the description will be given in the following order.
1. Overview
2. First embodiment (Feed-forward method)
3. Second embodiment (Feed-forward method)
4. Third embodiment (Feedback method)
5. Fourth embodiment (Feedback method and feed-forward method)
6. Fifth embodiment (Feedback method)
7. Summary 1. Overview Before describing the embodiments of the present disclosure in detail, an overview of the embodiments of the present disclosure will be provided.

As described above, a general noise canceling system generates a signal that cancels noise collected by the noise detection microphone, and suppresses external noise by adding the signal to an audio signal. Then, as the noise canceling system, there are a feed-forward method, a feedback method, and a method combining the feed forward method and the feedback method. The feed-forward method is a method of performing signal processing to cancel a sound signal (external noise) collected by a microphone provided outside a housing of a headphone. The feedback method is a method of performing signal processing to cancel a sound signal (internal noise) collected by a microphone provided inside a housing of a headphone.

For example, Patent Document 1 discloses a technique for a noise canceling system that suppresses external noise using a feed-forward method. In the feed-forward method, bit extension is performed by a bit expander on an audio signal from a digital audio source to combine the signal with a noise canceling signal that is used to cancel a sound signal collected by a microphone. This process is performed to set a quantization bit number of the noise canceling signal and a quantization bit number of the audio signal to be corresponding to each other. In a case where the noise canceling signal and the audio signal are combined, the signals are converted to an analog signal through a delta sigma modulator and a low pass filter, and the sound is mainly output from headphones and earphones through an amplifier.

Also in the feedback method, bit extension is performed by an equalizer on an audio signal from a digital audio source to combine the signal with a noise canceling signal that is used to cancel a sound signal collected by a microphone. In a case where the noise canceling signal and the audio signal are combined, the signals are converted to an analog signal through a delta sigma modulator and a low pass filter, and the sound is mainly output from headphones and earphones through an amplifier.

Here, in a case where an audio signal of a DSD system in which a sampling frequency is in an order of megahertz (for example, 2.8 MHz) and a quantization bit number is 1 bit is used as the audio signal, the quantization bit number of the audio signal is expanded to 16 bits to combine the audio signal with the noise canceling signal in which the quantization bit number is 16 bits, for example. Then, in a case where the noise canceling signal and the audio signal are combined, the delta sigma modulator converts the combined signal into a signal in which the quantization bit number is one bit. Here, focusing on a characteristic change of the DSD audio signal, an addition of quantization noise cannot be avoided since the signal passes through the delta sigma modulator, and this causes deterioration of the audio characteristic. Deterioration of the audio characteristic of a signal that passes through the delta sigma modulator can be seen in the feedback method in a similar manner.

Therefore, in view of the above-mentioned issue, a person who discloses the present disclosure has eagerly studied on a noise canceling system capable of suppressing external noise without degrading audio characteristic of a digital audio source. As a result, the person of the present disclosure has invented a noise canceling system capable of suppressing external noise without degrading audio characteristic of a digital audio source, as described below.

The overview of the embodiments of the present disclosure has been described above.

2. First Embodiment (Feed-Forward Method)

As a first embodiment, an example of a feed-forward noise canceling system that does not degrade an audio characteristic of a digital audio source will be described.

FIG. 1 is a diagram illustrating a configuration example of a noise canceling system according to the first embodiment of the present disclosure. In the following, a configuration example of the noise canceling system according to the first embodiment of the present disclosure will be described with reference to FIG. 1.

As illustrated in FIG. 1, the noise canceling system according to the first embodiment of the present disclosure includes a microphone 111, an amplifier 112, an A/D converter unit 120, a noise canceling digital filter 130, and a delta sigma modulator 132, an adder 134, a pulse width modulation (PWM) conversion unit 136, an analog low pass filter (LPF) 138, a power amplifier 140, and a headphone 150. The headphone 150 illustrated in FIG. 1 includes drivers 151 and 152 compatible with a two-channel stereo of left (L) and right (R), but the configuration of the noise canceling system illustrated in FIG. 1 is compatible with at least one of an L channel or an R channel. Then, it is assumed that, in the noise canceling system illustrated in FIG. 1, the sampling frequency of the digital audio source is 64 Fs (2.8224 MHz), and the quantization bit number is one bit. Although the digital audio source in the noise canceling system illustrated in FIG. 1 is assumed to be a DSD audio source, the present disclosure is not limited to this example.

The microphone 111 collects external sound (external noise), which is to be canceled in a vicinity of the headphone 150. In the feed-forward noise canceling system, the microphones 111 are respectively provided outside a housing of each of L and R single-side channels of the headphone 150 in actual. In FIG. 1, the microphone 111 provided corresponding to one of the L channel and the R channel is illustrated.

The amplifier 112 amplifies the external sound collected by the microphone 111 and an analog audio signal is obtained.

The A/D converter unit 120 converts the analog audio signal output from the amplifier 112 into a digital audio signal. The A/D converter unit 120 includes a delta sigma modulator 121. The delta sigma modulator 121 converts the analog audio signal output from the amplifier 112 into a digital signal of the same sampling frequency (64 Fs) and quantization bit number (one bit) as those of the digital audio source. Here, in the following description and the drawings, the sampling frequency of the signal and the quantization bit number are denoted as [sampling frequency, quantization bit number]. In a case where it is denoted as [64 Fs, 1 bit], the signal has the sampling frequency of 64 Fs and the quantization bit number of one bit.

The noise canceling digital filter 130 receives the digital audio signal output from the A/D converter unit 120, that is, the digital audio signal obtained by collecting the external sound collected by the microphone 111. Then, using the input digital audio signal, the noise canceling digital filter 130 generates an audio signal (sound signal for cancellation) of sound that is effective to cancel external sound that can reach an ear of a wearer of the headphone 150 and be heard corresponding to the driver 151 as sound to be output from the driver 151. As the simplest sound signal for cancellation, for example, the audio signal input to the noise canceling digital filter 130, that is, the audio signal obtained by collecting the external sound has an inverse characteristic and an antiphase. In actual, a characteristic considering the transfer characteristic such as circuits and spaces in the system of the noise canceling system are provided.

The noise canceling digital filter 130 is configured as, for example, a finite impulse response (FIR) filter. In the present embodiment, the noise canceling digital filter 130 is configured as a filter whose input is [64 Fs, 1 bit] and whose output is [64 Fs, 16 bits]. Therefore, the output of the noise canceling digital filter 130 is converted into a multi-bit.

The delta sigma modulator 132 converts the quantization bit number in the [64 Fs, 16 bits] digital signal output from the noise canceling digital filter 130 into one bit. In other words, the delta sigma modulator 132 generates a [64 Fs, 1 bit] digital signal from the [64 Fs, 16 bits] digital signal output from the noise canceling digital filter 130.

The adder 134 adds the signal of the digital audio source and the signal output from the delta sigma modulator 132. Regarding the signal after the addition by the adder 134, since two signals that can take binary values of 0 and 1 are added, the signal becomes a 2-bit signal that can take three values of 0, 1, and 2. That is, the adder 134 generates a [64 Fs, 2 bits] digital signal.

The noise canceling digital filter 130, the delta sigma modulator 132, and the adder 134 can be provided, for example, in a digital signal processor (DSP). This DSP may be provided, for example, as a single chip component.

The PWM conversion unit 136 performs PWM modulation on the [64 Fs, 2 bits] digital signal output from the adder 134. Then, the analog LPF 138 inputs a signal output from the PWM conversion unit 136 and generates an analog audio signal. The analog audio signal generated by the analog LPF 138 is input to the power amplifier 140. The power amplifier 140 amplifies the input audio signal and uses its output to drive the driver 151 in the headphone 150, corresponding to one of the ears.

Here, it is focused on a signal path of the digital audio source in the noise canceling system illustrated in FIG. 1. The signal of the digital audio source does not pass through the delta sigma modulator which may cause quantization noise. In other words, the signal of the digital audio source is synthesized as it is being a [64 Fs, 1 bit] digital signal with a [64 Fs, 1 bit] sound signal for canceling, and converted into an analog audio signal through the PWM conversion unit 136 and the analog LPF 138 without passing through the delta sigma modulator.

Therefore, the noise canceling system according to the first embodiment of the present disclosure favorably delivers sound of the digital audio source to a listener without degrading an audio characteristic of the digital audio source in a case where external noise is suppressed.

3. Second Embodiment (Feed-Forward Method)

As a second embodiment, an example of a feed-forward noise canceling system will be described which does not degrade an audio characteristic of a digital audio source, as in the first embodiment.

Figure 2:
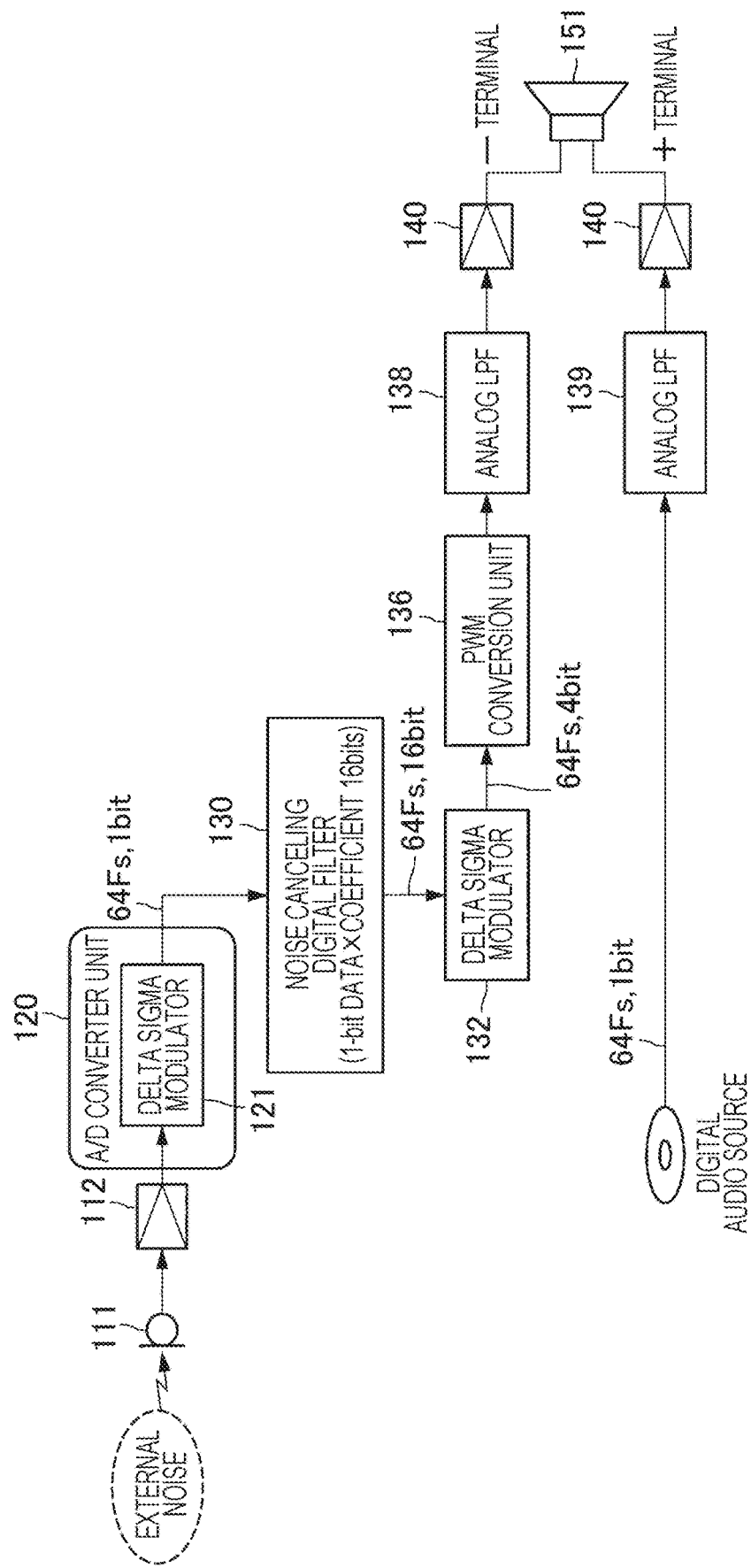
FIG. 2 is a diagram illustrating an example of the configuration of the noise canceling system according to a second embodiment of the present disclosure.

FIG. 2 is a diagram illustrating a configuration example of a noise canceling system according to the second embodiment of the present disclosure. In the following, a configuration example of the noise canceling system according to the second embodiment of the present disclosure will be described with reference to FIG. 2. Although the digital audio source in the noise canceling system illustrated in FIG. 2 is a DSD audio source, the present disclosure is not limited to this example.

As compared with the noise canceling system illustrated in FIG. 1, the noise canceling system illustrated in FIG. 2 does not combine a signal from the digital audio source with a canceling sound signal. Although an input system to the driver 151 in the noise canceling system illustrated in FIG. 1 is represented by one system, in actual, the driver 151 has two terminals of positive and negative, and in the example illustrated in FIG. 1, one of the terminals is grounded. On the other hand, in the noise canceling system illustrated in FIG. 2, an analog signal based on the canceling sound signal is input to one of the terminals (the − terminal in the example of FIG. 2) of the driver 151 and an analog signal based on the digital audio source is input to the other terminal (the + terminal in the example of FIG. 2). In other words, in the noise canceling system illustrated in FIG. 2, the driver 151 has a form of bridged transformer less (BTL) connection.

That is, in the noise canceling system illustrated in FIG. 2, PWM modulation is performed in the PWM conversion unit 136.

In addition to the synthesis by the adder 134 in the noise canceling system illustrated in FIG. 1, the BTL connection illustrated in FIG. 2 is capable of favorably delivering the sound of the digital audio source to the listener without degrading the audio characteristic of the digital audio source in a case where external noise is suppressed.

4. Third Embodiment (Feedback Method)

As a third embodiment, an example of a feedback noise canceling system will be described which does not degrade an audio characteristic of a digital audio source.

Figure 3:
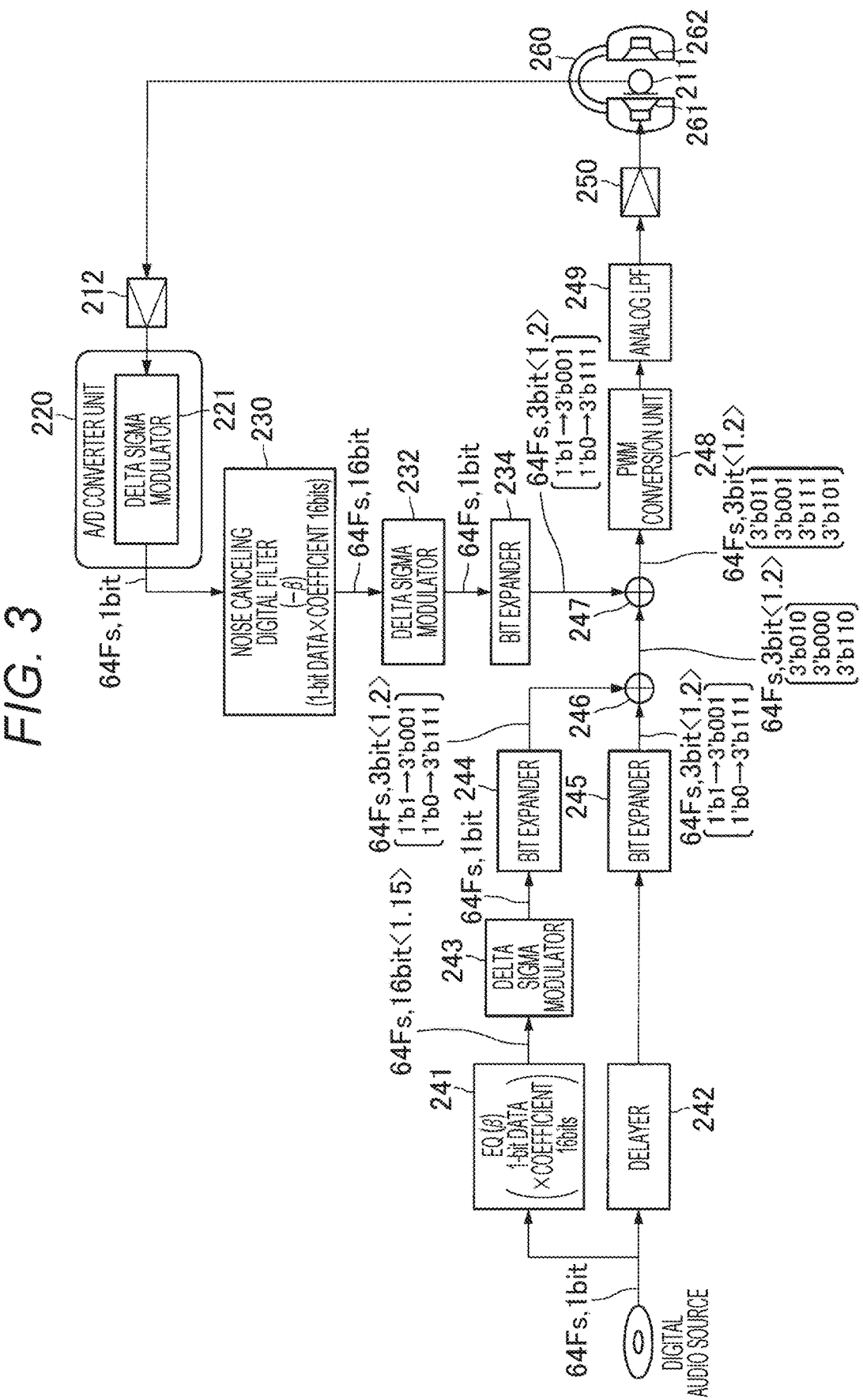
FIG. 3 is a diagram illustrating an example of the configuration of the noise canceling system according to a third embodiment of the present disclosure.

FIG. 3 is a diagram illustrating a configuration example of a noise canceling system according to the third embodiment of the present disclosure. In the following, a configuration example of the noise canceling system according to the third embodiment of the present disclosure will be described with reference to FIG. 3.

As illustrated in FIG. 3, the noise canceling system according to the first embodiment of the present disclosure includes a microphone 211, an amplifier 212, an A/D converter unit 220, a noise canceling digital filter 230, and delta sigma modulators 232 and 243, bit expanders 234, 244, and 245, an equalizer 241, a delayer 242, adders 246 and 247, a PWM conversion unit 248, an analog LPF 249, a power amplifier 250, and a headphone 260. The headphone 260 illustrated in FIG. 3 includes drivers 261 and 262 and corresponds to 2-channel stereo with left (L) and right (R), but the configuration of the noise canceling system illustrated in FIG. 3 corresponds to at least one of an L channel or an R channel. Then, the digital audio source in the noise canceling system illustrated in FIG. 3 is assumed to be [64 Fs, 1 bit]. Although the digital audio source in the noise canceling system illustrated in FIG. 3 is a DSD audio source, the present disclosure is not limited to this example.

The microphone 211 collects sound output from the driver 261 and external sound intruding into an inside of the housing of the headphone 260 to be canceled. In the feedback noise canceling system, the microphone 211 is actually provided inside the corresponding housing respectively for the L and R one-side channels of the headphones 260. In FIG. 3, it is assumed that microphone 211 provided corresponding to one of the L channel and R channel is illustrated.

The amplifier 212 amplifies the external sound collected by the microphone 211 and an analog audio signal is obtained.

The A/D converter unit 220 converts the analog audio signal output from the amplifier 212 into a digital audio signal. The A/D converter unit 220 includes a delta sigma modulator 221. The delta sigma modulator 221 converts the analog audio signal output from the amplifier 212 into a digital signal having same [64 Fs, 1 bit] as the digital audio source.

The noise canceling digital filter 230 inputs a digital audio signal, which is obtained by collecting the digital audio signal output from the A/D converter unit 220, that is, internal sound of the housing on a side of the driver 261 of the headphone 260 collected by the microphone 211. Then, the noise canceling digital filter 230 uses the input digital audio signal and generates an audio signal (a sound signal for cancellation) of sound, which is effective to cancel external sound that can be heard by reaching an ear of the wearer of the headphone 260 corresponding to the driver 261 as a sound to be output from the driver 261. More specifically, the noise canceling digital filter 230 processes to provide a predetermined transfer function −β for noise cancellation to the sound collected by the microphone 211.

In the present embodiment, the noise canceling digital filter 230 is configured as a filter whose input is [64 Fs, 1 bit] and whose output is [64 Fs, 16 bits]. Therefore, the output of the noise canceling digital filter 230 is converted into a multi-bit.

The delta sigma modulator 232 converts the quantization bit number in the [64 Fs, 16 bits] digital signal output from the noise canceling digital filter 230 into one bit. In other words, the delta sigma modulator 232 generates a [64 Fs, 1 bit] digital signal from the [64 Fs, 16 bits] digital signal output from the noise canceling digital filter 230.

The bit expander 234 converts the [64 Fs, 1 bit] digital signal output from the delta sigma modulator 232 into a [64 Fs, 3 bits] digital signal in this example. More specifically, the bit expander 234 respectively converts a value of the signal to "001" (0.25) if the value of the signal is "1" and to "111" (−0.25) if the value is "0".

The equalizer 241 provides the digital audio source with a characteristic based on the transfer function of the coefficient 13. Here, the equalizer 241 converts a [64 Fs, 1 bit] digital signal into a [64 Fs, 16 bits] digital signal in this example. The delta sigma modulator 243 performs delta sigma modulation on the output of the equalizer 241 and converts the output into a [64 Fs, 1 bit] digital signal. The delayer 242 performs predetermined delay processing on the signal from the digital audio source in accordance with a delay due to the signal processing of the equalizer 241 and the delta sigma modulator 243.

The bit expander 244 converts the [64 Fs, 1 bit] digital signal output from the delta sigma modulator 243 into a [64

Fs, 3 bits] digital signal in this example. More specifically, the bit expander 244 respectively converts a value of the signal to "001" (0.25) if the value is "1" and to "111" (−0.25) if the value is "0". Furthermore, the bit expander 244 converts the [64 Fs, 1 bit] digital signal output from the delayer 242 into a [64 Fs, 3 bits] digital signal. More specifically, the bit expander 245 respectively converts the signal value to "001" (0.25) if the signal value is "1", and to "111" (−0.25) if the signal value is "0" in a similar manner. The adder 246 adds the outputs of the bit expanders 244 and 245.

Here, the reason why the equalizer 241 provides the characteristic by the transfer function of the coefficient 3, will be described. In a case of the feedback method, the canceling sound signal output from the noise canceling digital filter 230 includes not only the component corresponding to the external sound but also the component obtained by collecting the sound of the digital audio source output from the driver 261. In other words, a characteristic according to the transfer function represented by 1/(1+β) is provided with the sound component of the digital audio source. Therefore, the characteristic of a 1+β, transfer function, which is 1/(1+β), is provided in advance with the signal of the digital audio source. The equalizer 241 provides the characteristic by the transfer function of β, from the functions. The addition of the signal by the adder 246 serves equivalent to the provision of the characteristic by the transfer function of 1+β, to the digital audio source. The signal after the addition by the adder 246 can take three 3-bit values, which are "010" (0.5), "000" (0), and "110" (−0.5).

The adder 247 adds the output of the bit expander 234 and the output of the adder 246. The signal after the addition by the adder 247 can take four 3-bit values, which are "011" (0.75), "001" (0.25), "111" (−0.25) and "101" (−0.75).

The noise canceling digital filter 230, the delta sigma modulators 232 and 243, the bit expanders 234, 244, and 245, the equalizer 241, the delayer 242 and the adders 246 and 247 can be provided in, for example, a DSP. This DSP may be provided, for example, as a single chip component.

The PWM conversion unit 248 performs PWM modulation on the [64 Fs, 3 bits] digital signal output from the adder 247. The analog LPF 249 inputs the signal output from the PWM conversion unit 248 and generates an analog audio signal. The analog audio signal generated by the analog LPF 249 is input to the power amplifier 250. The power amplifier 250 amplifies the input audio signal and drives the driver 261 corresponding to one of the ears in the headphone 260 by using its output.

Here, it is focused on a signal path of the digital audio source in the noise canceling system illustrated in FIG. 3. The signal of the digital audio source (signal passing through the delayer 242) which is not provided with the characteristic β by the transfer function does not pass through the delta sigma modulator which may cause quantization noise. In other words, the signal of the digital audio source to which the characteristic β, by the transfer function is not provided is converted into an analog audio signal through the PWM conversion unit 248 and the analog LPF 249 without passing through the delta sigma modulator.

Therefore, the noise canceling system according to the third embodiment of the present disclosure favorably delivers the sound of the digital audio source to the listener without degrading the audio characteristic of the digital audio source in a case where external noise is suppressed.

5. Fourth Embodiment (Feedback Method and Feed-Forward Method)

As a fourth embodiment, an example of a noise canceling system will be described, in which an audio characteristic of a digital audio source are not degraded in a noise canceling system combining a feedback method and a feed-forward method.

Figure 4:
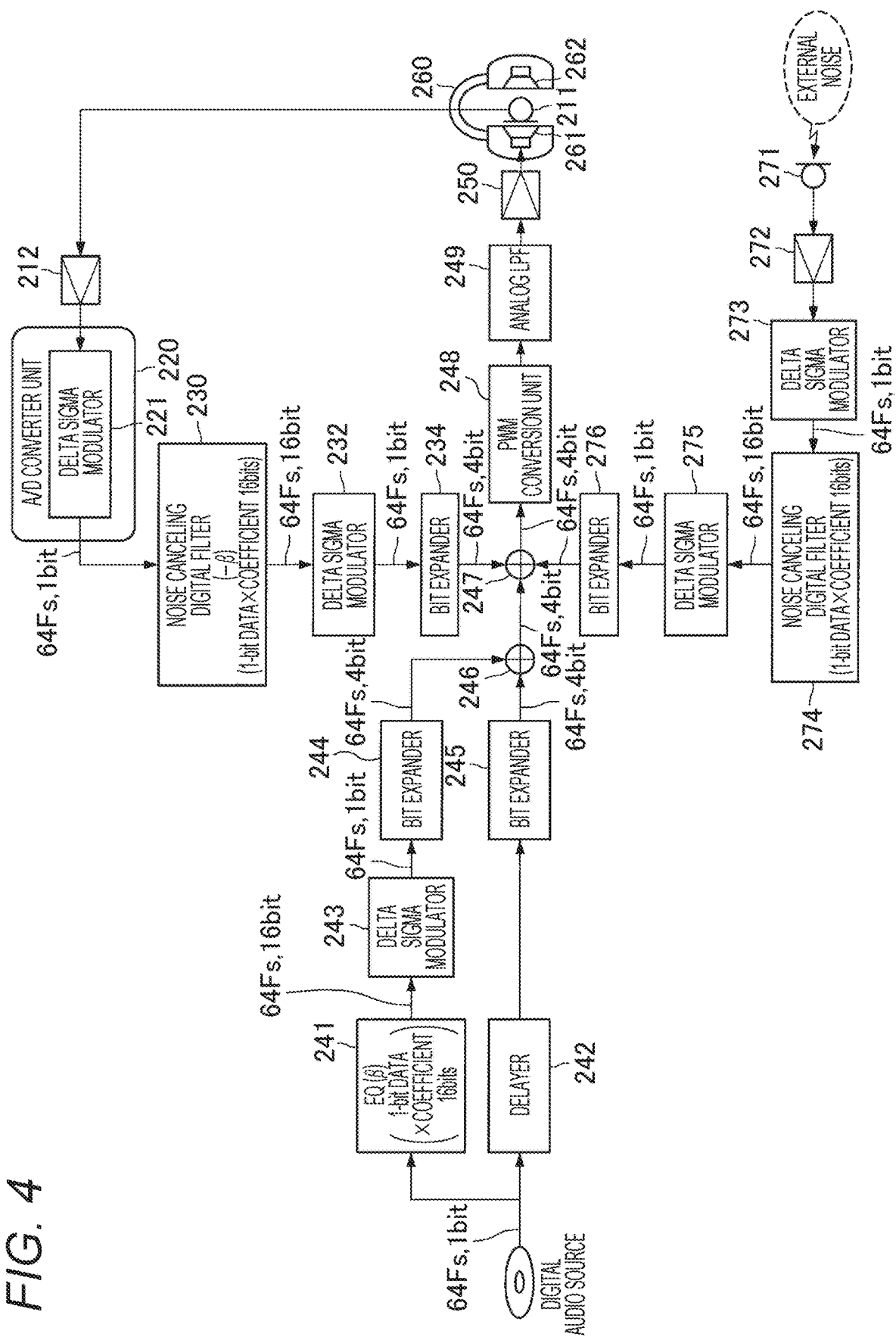
FIG. 4 is a diagram illustrating an example of the configuration of the noise canceling system according to a fourth embodiment of the present disclosure.

FIG. 4 is a diagram illustrating a configuration example of a noise canceling system according to the fourth embodiment of the present disclosure. In the following, a configuration example of the noise canceling system according to the fourth embodiment of the present disclosure will be described with reference to FIG. 4. Although the digital audio source in the noise canceling system illustrated in FIG. 4 is a DSD audio source, the present disclosure is not limited to such an example.

The noise canceling system illustrated in FIG. 4 is a combination of the noise canceling system, which is a combination of the feedback noise canceling system illustrated in FIG. 3 and a feed-forward noise canceling system. In other words, the noise canceling system illustrated in FIG. 4 is different from the feedback noise canceling system illustrated in FIG. 3 in that a microphone 271, an amplifier 272, delta sigma modulators 273 and 275, a noise canceling digital filter 274, and a bit expander 276 are added.

The microphone 271 collects external sound (external noise), which is to be canceled, in a vicinity of the headphone 260. In the feed-forward noise canceling system, the microphones 271 are respectively provided outside a housing of each of L and R single-side channels of the headphone 260 in actual. In FIG. 4, the microphone 271 provided corresponding to one of the L channel and R channel is illustrated.

The amplifier 272 amplifies the external sound collected by the microphone 271 and an analog audio signal is obtained. The delta sigma modulator 273 converts the analog audio signal output from the amplifier 272 into a digital signal having same [64 Fs, 1 bit] as the digital audio source.

The noise canceling digital filter 274 receives the digital audio signal output from the delta sigma modulator 273, that is, the digital audio signal obtained by collecting the external sound collected by the microphone 271. Then, the noise canceling digital filter 274 uses the input digital audio signal and generates a sound signal for cancellation of sound, which is effective to cancel external sound that can be heard by reaching an ear of the wearer of the headphone 260 corresponding to the driver 261 as a sound to be output from the driver 261. The noise canceling digital filter 274 is configured, for example, as an FIR filter. In the present embodiment, the noise canceling digital filter 274 is configured as a filter whose input is [64 Fs, 1 bit] and whose output is [64 Fs, 16 bits]. Therefore, the output of the noise canceling digital filter 274 is converted into a multi-bit.

The delta sigma modulator 275 converts the quantization bit number in the [64 Fs, 16 bits] digital signal output from the noise canceling digital filter 274 into one bit. That is, the delta sigma modulator 275 generates a [64 Fs, 1 bit] digital signal from the [64 Fs, 16 bits] digital signal output from the noise canceling digital filter 274.

The bit expander 276 converts the [64 Fs, 1 bit] digital signal output from the delta sigma modulator 275 into a [64 Fs, 4 bits] digital signal in this example. In the present embodiment, the bit expanders 234, 244, and 245 also convert a [64 Fs, 1 bit] digital signal into a [64 Fs, 4 bits] digital signal in a similar manner. In other words, each bit expander extends the digital signal having a quantization bit number of one bit into four bits so as to correspond to the addition of four digital signals.

The digital signal output from the bit expander 276 is added together with the output of the bit expander 234 and the output of the adder 246 in the adder 247.

The noise canceling system illustrated in FIG. 4 can further enhance the external noise suppression effect by combining the feed-forward noise canceling system and the feedback noise canceling system. Then, the noise canceling system according to the fourth embodiment of the present disclosure favorably delivers the sound of the digital audio source to the listener without degrading the audio characteristic of the digital audio source in a case where external noise is suppressed.

6. Fifth Embodiment (Front-Rear Insertion Feedback Method)

As a feedback noise canceling system, a method that suppresses the degradation of the quality of the audio signal while suppressing external noise by adding an audio component before and after the block providing a predetermined transfer function for noise cancellation (known as a front-rear insertion feedback method). For example, Patent Document 2 (Japanese Patent Application Laid-Open No. 2009-33309) describes a front-rear insertion feedback method.

In a fifth embodiment of the present disclosure, a noise canceling system will be described which does not degrade an audio characteristic of a digital audio source in a case where external noise is suppressed by the front-rear insertion feedback method.

Figure 5:
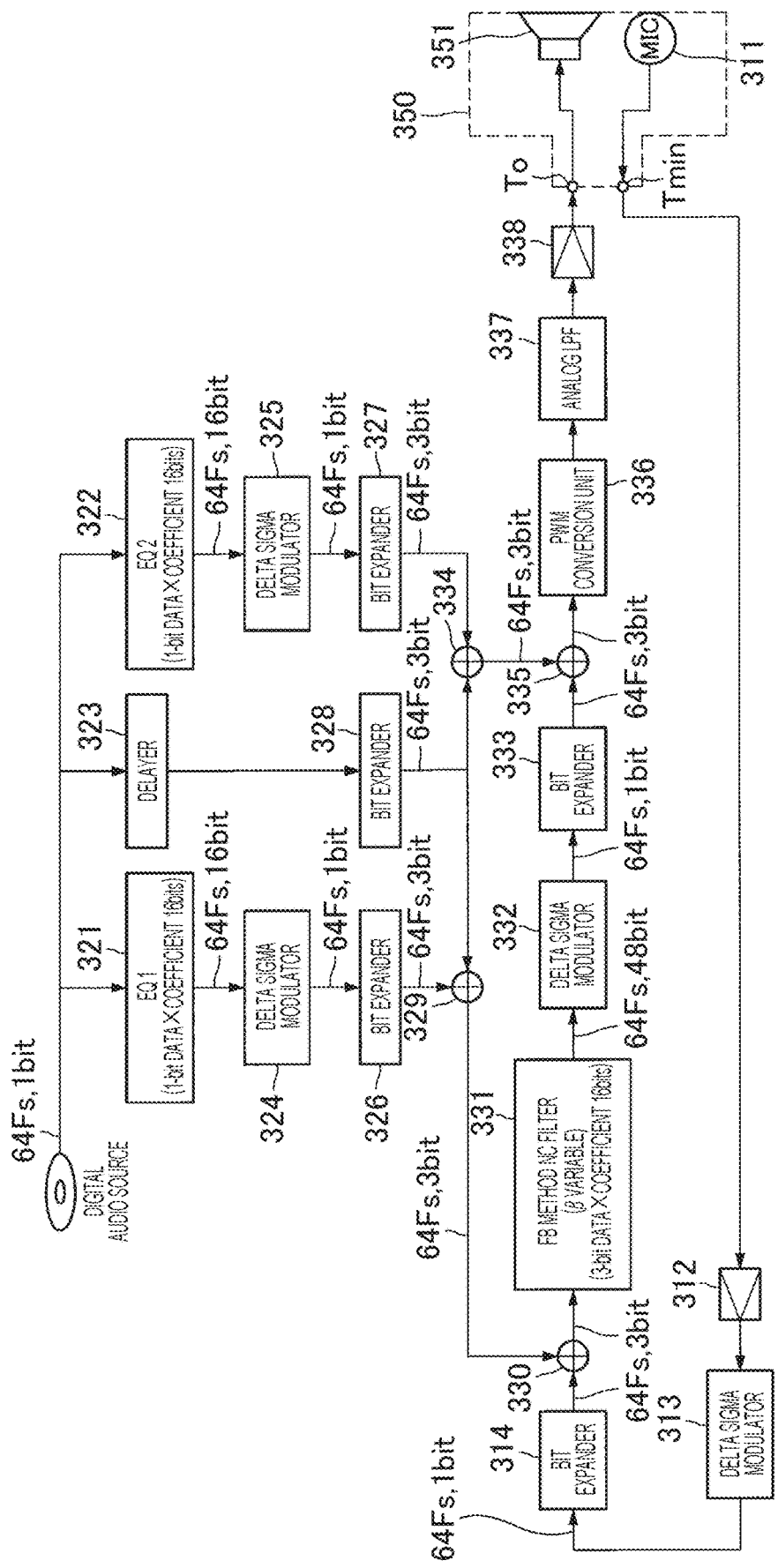
FIG. 5 is a diagram illustrating an example of the configuration of the noise canceling system according to a fifth embodiment of the present disclosure.

FIG. 5 is a diagram illustrating a configuration example of the noise canceling system according to the fifth embodiment of the present disclosure. In the following, a configuration example of the noise canceling system according to the fifth embodiment of the present disclosure will be described with reference to FIG. 5. Although the digital audio source in the noise canceling system illustrated in FIG. 5 is a DSD audio source, the present disclosure is not limited to this example.

As illustrated in FIG. 5, the noise canceling system according to the fifth embodiment of the present disclosure includes a microphone 311, an amplifier 312, delta sigma modulators 313, 324, 325, and 332, bit expanders 314, 326, 327, 328, and 333, equalizers 321 and 322, a delayer 323, adders 329, 330, 334, and 335, a noise canceling digital filter 331, a PWM conversion unit 336, an analog LPF 337, a power amplifier 338, and a headphone 350.

The microphone 311 collects sound output from the driver 351 and external sound intruding into an inside of a housing of the headphone 350, which can be cancellation targets. In the feedback noise canceling system, the microphones 311 are actually provided inside the corresponding housing for each of L and R one-side channels of the headphone 350. In FIG. 5, the microphone 311 provided corresponding to one of the L channel and R channel is illustrated.

The amplifier 312 amplifies the external sound collected by the microphone 311 and an analog audio signal is obtained.

The delta sigma modulator 313 converts the analog audio signal output from the amplifier 312 into a digital audio signal. The delta sigma modulator 313 converts the analog audio signal output from the amplifier 312 into a digital signal having same [64 Fs, 1 bit] as the digital audio source.

The bit expander 314 converts the [64 Fs, 1 bit] digital signal output from the delta sigma modulator 313 into a [64 Fs, 3 bits] digital signal in this example. More specifically, the bit expander 314 converts the signal value into "001" (0.25) if the value of the signal is "1" and to "111" (−0.25) if the value is "0".

The equalizer 321 is a processing block that provides the audio source with a predetermined target characteristic on a front insertion side. Also, the equalizer 322 is a processing block that provides the audio source with a predetermined target characteristic on a rear insertion side. The equalizers 321 and 322 convert a [64 Fs, 1 bit] digital signal into a [64 Fs, 16 bits] digital signal in this example. The delayer 323 performs predetermined delay processing on the signal from the digital audio source in accordance with the delay due to the signal processing in the equalizers 321 and 322 and the delta sigma modulators 324 and 325.

Here, an equalizer target characteristic EQ1 on the front insertion side and an equalizer target characteristic EQ2 on the rear insertion side both become approximately a Mid Presence Filter (hereinafter, referred to as MPF), and the characteristics are generally equalizing-adjusted. Since MPF can develop a transfer function like "1+EQ", [64 Fs, 1 bit] of the digital audio source DSD format is branched to "1" side processing and "EQ" side processing of the target characteristic "1+EQ" and then the results are synthesized. A path passing through the delayer 323 corresponds to the former processing on the "1" side.

The delta sigma modulator 324 converts the audio signal output from the equalizer 321 into a digital signal having the same [64 Fs, 1 bit] as the digital audio source. The delta sigma modulator 325 converts the audio signal output from the equalizer 321 into a digital signal having the same [64 Fs, 1 bit] as the digital audio source.

The bit expanders 326, 327, and 328 respectively convert the [64 Fs, 1 bit] digital signals output from the delta sigma modulator 324, the delayer 323, and the delta sigma modulator 325 into [64 Fs, 3 bits] digital signals in this example. More specifically, the bit expanders 326, 327, and 328 convert the signal value to "001" (0.25) if the signal value is "1", and to "111" (−0.25) if the signal value is "0", respectively.

The adder 329 adds the outputs of the bit expanders 326 and 328. The outputs of the bit expanders 326 and 328 are added to achieve the target characteristic "1+EQ" described above. The signal after the addition of the adder 329 can take three 3-bit values of "010" (0.5), "000" (0), and "110" (−0.5). Then, the adder 330 adds the output of the bit expander 314 and the output of the adder 329. The signal after addition of the adder 330 can take four 3-bit values of "011" (0.75), "001" (0.25), "111" (−0.25), and "101" (−0.75).

The noise canceling digital filter 331 inputs a signal including a signal output from the adder 330, that is, a digital audio signal obtained by collecting the internal sound of the housing on the driver 351 side of the headphone 350 collected by the microphone 311. Then, using the input digital audio signal, the noise canceling digital filter 331 generates an audio signal (sound signal for cancellation) of sound, which is effective to cancel external sound that can be heard by reaching an ear of a wearer of the headphone 350 corresponding to the driver 351 as sound to be output from the driver 351. More specifically, the noise canceling digital filter 331 performs processing for providing a predetermined transfer function −β for noise cancellation to the sound collected by the microphone 311. In the present embodiment, β is variable.

According to the present embodiment, the noise canceling digital filter 331 is configured as a filter whose input is [64 Fs, 3 bits] and whose output is [64 Fs, 48 bits]. Therefore, the output of the noise canceling digital filter 331 is converted into a multi-bit.

The delta sigma modulator 332 converts the quantization bit number in the [64 Fs, 48 bits] digital signal output from the noise canceling digital filter 331 into one bit. In other words, the delta sigma modulator 332 generates a [64 Fs, 1 bit] digital signal from the [64 Fs, 48 bits] digital signal output from the noise canceling digital filter 331.

The bit expander 333 converts the [64 Fs, 1 bit] digital signal output from the delta sigma modulator 332 into a [64 Fs, 3 bits] digital signal in this example. More specifically, the bit expander 314 converts the signal value into "001" (0.25) if the value of the signal is "1" and to "111" (−0.25) if the value is "0".

The adder 334 adds the outputs of the bit expanders 327 and 328. The outputs of the bit expanders 327 and 328 are added to achieve the target characteristic "1+EQ" described above. The signal after the addition of the adder 329 can take three 3-bit values of "010" (0.5), "000" (0), and "110" (−0.5). Then, the adder 335 adds the output of the bit expander 333 and the output of the adder 334. The signal after addition of the adder 335 can take four 3-bit values of "011" (0.75), "001" (0.25), "111" (−0.25), and "101" (−0.75).

The delta sigma modulators 313, 324, 325, and 332, the bit expanders 314, 326, 327, 328, and 333, the equalizers 321 and 322, the delayer 323, the adders 329, 330, 334, and 335, and the noise canceling digital filter 331 may be provided, for example, in the DSP. This DSP may be provided, for example, as a single chip component.

The PWM conversion unit 336 performs PWM modulation on the [64 Fs, 3 bits] digital signal output from the adder 335. Then, the analog LPF 337 receives the signal output from the PWM conversion unit 336 and generates an analog audio signal. The analog audio signal generated by the analog LPF 337 is input to the power amplifier 338. The power amplifier 338 amplifies the input audio signal and drives the driver 351 corresponding to one ear in the headphone 350 by using the output.

Here, it is focused on a signal path of the digital audio source in the noise canceling system illustrated in FIG. 5. The signal of the digital audio source which is not provided with the characteristic β by the transfer function (that is, the signal via the delayer 323 and the adders 334 and 335) does not pass through the delta sigma modulator which may cause quantization noise. In other words, the signal of the digital audio source, which is not provided with the characteristic β by the transfer function, is converted to an analog audio signal through the PWM conversion unit 336 and the analog LPF 337 without being passed through the delta sigma modulator.

Therefore, the noise canceling system according to the fifth embodiment of the present disclosure favorably delivers the sound of the digital audio source to the listener without degrading the audio characteristic of the digital audio source in a case where external noise is suppressed.

7. Summary

As described above, according to the embodiments of the present disclosure, a noise canceling system is provided which can favorably deliver sound of a digital audio source to a listener without degrading an audio characteristic of the digital audio source in a case where external noise is suppressed.

It is possible to create a computer program that causes hardware included in each device, such as a CPU, a ROM, and a RAM, to provide the same function as the above described configuration of each device. Also, a storage medium storing such computer program can be provided. In addition, by configuring each functional block illustrated in the functional block diagram by hardware, the series of processes can be realized by the hardware.

Although the preferred embodiments of the present disclosure have been described in detail with reference to the accompanying drawings, the technical scope of the present disclosure is not limited to such examples. It is obvious that persons having ordinary knowledge in the technical field of the present disclosure can conceive various changes or modifications within the scope of the technical idea described in the claims and it is naturally understood to those changes and modifications belong to the technical scope of the present disclosure.

In addition, the effects described in this specification are merely illustrative or exemplary and does not set any limitation. In other words, the technique according to the present disclosure can provide other effects obvious to those skilled in the art from the description of the present specification together with the above described effects or in addition to the above effects.

Note that the following configurations are also within the technical scope of the present disclosure.

(1)

A signal processing apparatus including:

an A/D converter configured to output a digital signal having a predetermined sampling frequency and quantization bit number a, the A/D converter including a first delta sigma modulator that performs a first delta sigma modulation process on an input analog signal;

a filter unit configured to pass an output of the A/D converter through a digital filter provided with a predetermined filter characteristic and output a digital signal having the sampling frequency and a quantization bit number b;

a second delta sigma modulator configured to perform a second delta sigma modulation process on an output of the filter unit and output a digital signal having the sampling frequency and the quantization bit number a; and an addition unit configured to add an output of the second delta sigma modulator and an input digital signal having the sampling frequency and the quantization bit number a.

(2)

The signal processing apparatus according to (1), in which the analog signal is sound collected by a microphone provided at a predetermined position in a headphone.

(3)

The signal processing apparatus according to (2), in which the predetermined filter characteristic is a filter characteristic for performing a feed-forward noise reduction process for the headphone.

(4)

The signal processing apparatus according to any one of (1) to (3), in which the input digital signal is a DSD audio signal.

(5)

A signal processing apparatus including:

an A/D converter configured to output a digital signal having a predetermined sampling frequency and a quantization bit number a, the A/D converter including a first delta sigma modulator that performs a first delta sigma modulation process on an input analog signal;

a filter unit configured to pass an output of the A/D converter through a digital filter provided with a predetermined filter characteristic and output a digital signal having the sampling frequency and a quantization bit number b;

a second delta sigma modulator configured to perform a second delta sigma modulation process on an output of the filter unit and output a digital signal having the sampling frequency and the quantization bit number a;

a first bit expander configured to expand the quantization bit number from a to c for an output of the second delta sigma modulator; and a first addition unit configured to add an output of the first bit expander and an input digital signal having the sampling frequency and a quantization bit number c.

(6)

The signal processing apparatus according to (5), in which the analog signal is sound collected by a microphone provided at a predetermined position in a headphone.

(7)

The signal processing apparatus according to (6), in which the predetermined filter characteristic is a filter characteristic for performing a feedback noise reduction process for the headphone.

(8)

The signal processing apparatus according to (6) or (7), in which the digital signal, the digital signal having passed through the digital filter provided with the filter characteristic for performing the feed-forward noise reduction process for the headphone, is also added to the first addition unit.

(9)

The signal processing apparatus according to any one of (5) to (8), further including:

an equalizer unit configured to equalize the input digital signal with a predetermined target characteristic;

a third delta sigma modulator configured to perform a third delta sigma modulation process on an output of the equalizer unit and output a digital signal having the sampling frequency and the quantization bit number a;

a delay unit configured to provide the input digital signal with a delay equivalent to processing delay in the equalizer unit and the third delta sigma modulator;

a second bit expander configured to expand the quantization bit number from a to c for an output of the third delta sigma modulator;

a third bit expander configured to expand the quantization bit number from a to c for an output of the delay unit; and a second adder configured to add outputs of the second bit expander and the third bit expander and output a result to the first addition unit.

(10)

The signal processing apparatus according to any one of (5) to (9), in which the input digital signal is a DSD audio signal.

(11)

A signal processing apparatus including:

a first delta sigma modulation unit configured to perform a first delta sigma modulation process on an input analog signal, generate a digital signal having a predetermined sampling frequency and a quantization bit number a, and output the digital signal after expanding its quantization bit number from a to c;

a first equalizer unit configured to generate a first equalized signal by equalizing an input digital signal having the sampling frequency and a quantization bit number c with a first target characteristic, perform a delta sigma modulation process on the first equalized signal, generate a digital signal having the predetermined sampling frequency and the quantization bit number a, and output the digital signal after expanding its quantization bit number from a to c;

a second equalizer unit configured to generate a second equalized signal by equalizing an input digital signal having the sampling frequency and the quantization bit number c with a second target characteristic, perform the delta sigma modulation process on the second equalized signal, generate a digital signal having the predetermined sampling frequency and the quantization bit number a, and output the digital signal after expanding its quantization bit number from a to c;

a delay unit configured to provide the input digital signal with a delay equivalent to processing delay in the first equalizer unit or the second equalizer unit, and output the signal after expanding its quantization bit number from a to c;

a first addition unit configured to add outputs of the first delta sigma modulation unit, the delay unit, and the first equalizer unit;

a filter unit configured to pass an output of the first addition unit through a digital filter provided with a predetermined filter characteristic and output a digital signal having the sampling frequency and a quantization bit number b;

a second delta sigma modulation unit configured to perform a delta sigma modulation process on an output of the filter unit, generate a digital signal having the sampling frequency and the quantization bit number a, and output the digital signal after expanding its quantization bit number from a to c; and a second addition unit configured to add outputs of the second delta sigma modulation unit, the delay unit, and the second equalizer unit.

(12)

The signal processing apparatus according to (11), in which the analog signal is sound collected by a microphone provided at a predetermined position in a headphone.

(13)

The signal processing apparatus according to (12), in which the predetermined filter characteristic is a filter characteristic for performing a feedback noise reduction process for the headphone.

(14)

The signal processing apparatus according to any one of (11) to (13), in which the input digital signal is a DSD audio signal.

(15)

A signal processing method including:

outputting a digital signal having a predetermined sampling frequency and a quantization bit number a by performing a first delta sigma modulation process on an input analog signal;

passing a digital signal having the predetermined sampling frequency and the quantization bit number a through a digital filter provided with a predetermined filter characteristic and outputting a digital signal having the sampling frequency and a quantization bit number b;

outputting a digital signal having the sampling frequency and the quantization bit number a by performing a second delta sigma modulation process on the digital signal having the quantization bit number b; and adding an output of the second delta sigma modulation process and an input digital signal having the sampling frequency and the quantization bit number a.

(16)

A signal processing method including:

outputting a digital signal having a predetermined sampling frequency and a quantization bit number a by performing a first delta sigma modulation process on an input analog signal;

passing a digital signal having the predetermined sampling frequency and the quantization bit number a through a digital filter provided with a predetermined filter characteristic and outputting a digital signal having the sampling frequency and a quantization bit number b;

outputting a digital signal having the sampling frequency and the quantization bit number a by performing a second delta sigma modulation process on an output of the digital signal having the sampling frequency and the quantization bit number b;

expanding the quantization bit number from a to c for an output of the second delta sigma modulation process; and adding the digital signal having an expanded quantization bit number c and an input digital signal having the sampling frequency and a quantization bit number c.

(17)

A signal processing method including:

performing a first delta sigma modulation process where a digital signal having a predetermined sampling frequency and a quantization bit number a is generated by performing a delta sigma modulation process on an input analog signal, and the digital signal is output after expanding its quantization bit number from a to c;

performing a first equalization process where a first equalized signal is generated by equalizing an input digital signal having the sampling frequency and a quantization bit number c with a first target characteristic, a delta sigma modulation process is performed on the first equalized signal, a digital signal having the predetermined sampling frequency and the quantization bit number a is generated, and the digital signal is output after expanding its quantization bit number from a to c;

performing a second equalization process where a second equalized signal is generated by equalizing an input digital signal having the sampling frequency and a quantization bit number c with a second target characteristic, a delta sigma modulation process is performed on the second equalized signal, a digital signal having the predetermined sampling frequency and the quantization bit number a is generated, and the digital signal is output after expanding its quantization bit number from a to c;

performing a delay process where the input digital signal is provided with a delay equivalent to processing delay in the first equalization process or the second equalization process, and the signal is output after expanding its quantization bit number from a to c;

performing a first addition process where outputs of the first delta sigma modulation process, the delay process, and the first equalization process;

performing a filter process where an output of the first addition process is passed through a digital filter provided with a predetermined filter characteristic and, a digital signal having the sampling frequency and a quantization bit number b is output;

performing a second delta sigma modulation process where a digital signal having the sampling frequency and the quantization bit number a is generated by performing a delta sigma modulation process on an output of the filter process and the digital signal is output after expanding its quantization bit number from a to c; and performing a first addition process where outputs of the second delta sigma modulation process, the delay process, and the second equalization process.

(18)

A computer program that causes a computer to execute:

outputting a digital signal having a predetermined sampling frequency and a quantization bit number a by performing a first delta sigma modulation process on an input analog signal;

passing a digital signal having the predetermined sampling frequency and the quantization bit number a through a digital filter provided with a predetermined filter characteristic and outputting a digital signal having the sampling frequency and a quantization bit number b;

outputting a digital signal having the sampling frequency and the quantization bit number a by performing a second delta sigma modulation process on the digital signal having the quantization bit number b; and adding an output of the second delta sigma modulation process and an input digital signal having the sampling frequency and the quantization bit number a.

(19)

A computer program that causes a computer to execute:

outputting a digital signal having a predetermined sampling frequency and a quantization bit number a by performing a first delta sigma modulation process on an input analog signal;

passing a digital signal having the predetermined sampling frequency and the quantization bit number a through a digital filter provided with a predetermined filter characteristic and outputting a digital signal having the sampling frequency and a quantization bit number b;

outputting a digital signal having the sampling frequency and the quantization bit number a by performing a second delta sigma modulation process on an output of the digital signal having the sampling frequency and the quantization bit number b;

expanding the quantization bit number from a to c for an output of the second delta sigma modulation process; and adding the digital signal having an expanded quantization bit number c and an input digital signal having the sampling frequency and a quantization bit number c.

(20)

A computer program that causes a computer to execute:

performing a first delta sigma modulation process where a digital signal having a predetermined sampling frequency and a quantization bit number a is generated by performing a delta sigma modulation process on an input analog signal, and the digital signal is output after expanding its quantization bit number from a to c;

performing a first equalization process where a first equalized signal is generated by equalizing an input digital signal having the sampling frequency and a quantization bit number c with a first target characteristic, a delta sigma modulation process is performed on the first equalized signal, a digital signal having the predetermined sampling frequency and the quantization bit number a is generated, and the digital signal is output after expanding its quantization bit number from a to c;

performing a second equalization process where a second equalized signal is generated by equalizing an input digital signal having the sampling frequency and a quantization bit number c with a second target characteristic, a delta sigma modulation process is performed on the second equalized signal, a digital signal having the predetermined sampling frequency and the quantization bit number a is generated, and the digital signal is output after expanding its quantization bit number from a to c;

performing a delay process where the input digital signal is provided with a delay equivalent to processing delay in the first equalization process or the second equalization process, and the signal is output after expanding its quantization bit number from a to c;

performing a first addition process where outputs of the first delta sigma modulation process, the delay process, and the first equalization process;

performing a filter process where an output of the first addition process is passed through a digital filter provided with a predetermined filter characteristic, and a digital signal having the sampling frequency and a quantization bit number b is output;

performing a second delta sigma modulation process where a digital signal having the sampling frequency and the quantization bit number a is generated by performing a delta sigma modulation process on an output of the filter process and the digital signal is output after expanding its quantization bit number from a to c; and performing a first addition process where outputs of the second delta sigma modulation process, the delay process, and the second equalization process.

REFERENCE SIGNS LIST

111 Microphone
112 Amplifier
134 Adder
140 Power amplifier
150 Headphone
151 Driver
152 Driver

The invention claimed is:

1. A signal processing apparatus comprising:
an A/D converter configured to output a first digital signal having a predetermined sampling frequency and quantization bit number a, the A/D converter including a first delta sigma modulator that performs a first delta sigma modulation process on an input analog signal;
a filter unit configured to pass the first digital signal through a digital filter provided with a predetermined filter characteristic and output a second digital signal having a sampling frequency and a quantization bit number b;
a second delta sigma modulator configured to perform a second delta sigma modulation process on the second digital signal and output a third digital signal having the predetermined sampling frequency and the quantization bit number a; and
an addition unit configured to add the third digital signal and an input digital signal having the predetermined sampling frequency and the quantization bit number a.

2. The signal processing apparatus according to claim 1, wherein the analog signal is sound collected by a microphone provided at a predetermined position in a headphone.

3. The signal processing apparatus according to claim 2, wherein the predetermined filter characteristic is a filter characteristic for performing a feed-forward noise reduction process for the headphone.

4. The signal processing apparatus according to claim 1, wherein the input digital signal is a DSD (direct stream digital) audio signal.

5. A signal processing apparatus comprising:
an A/D converter configured to output a first digital signal having a predetermined sampling frequency and a quantization bit number a, the A/D converter including a first delta sigma modulator that performs a first delta sigma modulation process on an input analog signal;
a filter unit configured to pass the first digital signal through a digital filter provided with a predetermined filter characteristic and output a second digital signal having a sampling frequency and a quantization bit number b;
a second delta sigma modulator configured to perform a second delta sigma modulation process on the second digital signal and output a third digital signal having the predetermined sampling frequency and the quantization bit number a;
a first bit expander configured to expand the quantization bit number of the third digital signal from a to c to generate a fourth digital signal; and
a first addition unit configured to add the fourth digital signal and an input digital signal having the sampling frequency and a quantization bit number c.

6. The signal processing apparatus according to claim 5, wherein the analog signal is sound collected by a microphone provided at a predetermined position in a headphone.

7. The signal processing apparatus according to claim 6, wherein the predetermined filter characteristic is a filter characteristic for performing a feedback noise reduction process for the headphone.

8. The signal processing apparatus according to claim 6, wherein the digital signal, the digital signal having passed through the digital filter provided with the filter characteristic for performing the feed-forward noise reduction process for the headphone, is also added to the first addition unit.

9. The signal processing apparatus according to claim 5, further comprising:
an equalizer unit configured to equalize the input digital signal with a predetermined target characteristic;
a third delta sigma modulator configured to perform a third delta sigma modulation process on an output of the equalizer unit and output the second digital signal having the predetermined sampling frequency and the quantization bit number a;
a delay unit configured to provide the input digital signal with a delay equivalent to processing delay in the equalizer unit and the third delta sigma modulator;
a second bit expander configured to expand the quantization bit number from a to c for an output of the third delta sigma modulator;
a third bit expander configured to expand the quantization bit number from a to c for an output of the delay unit; and
a second adder configured to add outputs of the second bit expander and the third bit expander and output a result to the first addition unit.

10. The signal processing apparatus according to claim 5, wherein the input digital signal is a DSD (direct stream digital) audio signal.

11. A signal processing apparatus comprising:
a first delta sigma modulation unit configured to perform a first delta sigma modulation process on an input analog signal to:
generate a first digital signal having a predetermined sampling frequency and a quantization bit number,
expand the quantization bit number of the first digital signal from a to c, and
output a second digital signal;
a first equalizer unit configured to perform a first equalizing process on an input digital signal having the predetermined sampling frequency and the quantization bit number a with a first target characteristic to:
generate a first equalized signal,
perform a delta sigma modulation process on the first equalized signal,
generate a third digital signal having the predetermined sampling frequency and the quantization bit number a,
expand the quantization bit number of the third digital signal from a to c, and output a fourth digital signal;
a second equalizer unit configured to perform a second equalizing process on the input digital signal with a second target characteristic to:
generate a second equalized signal,
perform a delta sigma modulation process on the second equalized signal,
generate a fifth digital signal having the predetermined sampling frequency and the quantization bit number a,
expand the quantization bit number of the fifth digital signal from a to c, and
output a sixth digital signal;
a delay unit configured to provide the input digital signal with a delay equivalent to processing delay in the first equalizer unit or the second equalizer unit to:
generate a seventh digital signal;
expand the quantization bit number of the seventh digital signal from a to c, and
output an eighth digital signal;
a first addition unit configured to add the second digital signal and the fourth digital to generate a ninth digital signal;
a filter unit configured to pass the ninth digital signal through a digital filter provided with a predetermined filter characteristic and output a tenth digital signal having the predetermined sampling frequency and a quantization bit number b;
a second delta sigma modulation unit configured to perform a delta sigma modulation process on the tenth digital signal to:
generate an eleventh digital signal having the predetermined sampling frequency and the quantization bit number a,
expand the quantization bit number of the eleventh digital signal from a to c, and
output a twelfth digital signal; and
a second addition unit configured to add the sixth digital signal, the eighth digital signal, and the twelfth digital signal.

12. The signal processing apparatus according to claim 11, wherein the analog signal is sound collected by a microphone provided at a predetermined position in a headphone.

13. The signal processing apparatus according to claim 11, wherein the predetermined filter characteristic is a filter characteristic for performing a feedback noise reduction process for the headphone.

14. The signal processing apparatus according to claim 11, wherein the input digital signal is a DSD (direct stream digital) audio signal.

15. A signal processing method comprising:
outputting a first digital signal having a predetermined sampling frequency and a quantization bit number a by performing a first delta sigma modulation process on an input analog signal;
passing the first digital signal having the predetermined sampling frequency and the quantization bit number a through a digital filter provided with a predetermined filter characteristic and outputting a second digital signal having the sampling frequency and a quantization bit number b;
outputting a third digital signal having the predetermined sampling frequency and the quantization bit number a by performing a second delta sigma modulation process on the second digital signal having the quantization bit number b; and
adding the third digital signal and an input digital signal having the sampling frequency and the quantization bit number a.

16. A signal processing method comprising:
outputting a first digital signal having a predetermined sampling frequency and a quantization bit number a by performing a first delta sigma modulation process on an input analog signal;
passing the first digital signal having the predetermined sampling frequency and the quantization bit number a through a digital filter provided with a predetermined filter characteristic and outputting a second digital signal having the predetermining sampling frequency and a quantization bit number b;
outputting a third digital signal having the predetermined sampling frequency and the quantization bit number a by performing a second delta sigma modulation process on an output of the digital signal having the sampling frequency and the quantization bit number b;
expanding the quantization bit number of the third digital signal from a to c for an output of the second delta sigma modulation process to generate a fourth digital signal; and
adding the fourth digital signal having an expanded quantization bit number c and an input digital signal having the sampling frequency and a quantization bit number c.

17. A non-transitory computer-readable storage medium storing a computer program that causes a computer to execute:
outputting a first digital signal having a predetermined sampling frequency and a quantization bit number a by performing a first delta sigma modulation process on an input analog signal;
passing the first digital signal having the predetermined sampling frequency and the quantization bit number a through a digital filter provided with a predetermined filter characteristic and outputting a second digital signal having the sampling frequency and a quantization bit number b;
outputting a third digital signal having the predetermined sampling frequency and the quantization bit number a by performing a second delta sigma modulation process on the second digital signal having the quantization bit number b; and
adding the third digital signal and an input digital signal having the sampling frequency and the quantization bit number a.

18. A non-transitory computer-readable storage medium storing a computer program that causes a computer to execute:
outputting a first digital signal having a predetermined sampling frequency and a quantization bit number a by performing a first delta sigma modulation process on an input analog signal;
passing the first digital signal having the predetermined sampling frequency and the quantization bit number a through a digital filter provided with a predetermined filter characteristic and outputting a second digital signal having the predetermined sampling frequency and a quantization bit number b;
outputting a third digital signal having the predetermined sampling frequency and the quantization bit number a by performing a second delta sigma modulation process on an output of the digital signal having the sampling frequency and the quantization bit number b;

expanding the quantization bit number of the third digital signal from a to c for an output of the second delta sigma modulation process to generate a fourth digital signal; and adding the fourth digital signal having an expanded quantization bit number c and an input digital signal having the sampling frequency and a quantization bit number c.

19. A signal processing method comprising:

performing a first delta sigma modulation unit configured to perform a first delta sigma modulation process on an input analog signal to:
- generate a first digital signal having a predetermined sampling frequency and a quantization bit number,
- expand the quantization bit number of the first digital signal from a to c, and
- output a second digital signal;

performing a first equalizing process on an input digital signal having the predetermined sampling frequency and the quantization bit number a with a first target characteristic to:
- generate a first equalized signal,
- perform a delta sigma modulation process on the first equalized signal,
- generate a third digital signal having the predetermined sampling frequency and the quantization bit number a,
- expand the quantization bit number of the third digital signal from a to c, and
- output a fourth digital signal;

performing a second equalizing process on the input digital signal with a second target characteristic to:
- generate a second equalized signal,
- perform a delta sigma modulation process on the second equalized signal,
- generate a fifth digital signal having the predetermined sampling frequency and the quantization bit number a,
- expand the quantization bit number of the fifth digital signal from a to c, and
- output a sixth digital signal;

providing the input digital signal with a delay equivalent to processing delay to:
- generate a seventh digital signal;
- expand the quantization bit number of the seventh digital signal from a to c, and
- output an eighth digital signal;

adding the second digital signal and the fourth digital to generate a ninth digital signal;

passing the ninth digital signal through a digital filter provided with a predetermined filter characteristic and output a tenth digital signal having the predetermined sampling frequency and a quantization bit number b;

performing a delta sigma modulation process on the tenth digital signal to:
- generate an eleventh digital signal having the predetermined sampling frequency and the quantization bit number a,
- expand the quantization bit number of the eleventh digital signal from a to c, and
- output a twelfth digital signal; and adding the sixth digital signal, the eighth digital signal, and the twelfth digital signal.

20. A non-transitory computer-readable storage medium having computer readable instructions stored thereon that, when executed by a computer, cause the computer to perform the steps of:

performing a first delta sigma modulation unit configured to perform a first delta sigma modulation process on an input analog signal to:
- generate a first digital signal having a predetermined sampling frequency and a quantization bit number,
- expand the quantization bit number of the first digital signal from a to c, and
- output a second digital signal;

performing a first equalizing process on an input digital signal having the predetermined sampling frequency and the quantization bit number a with a first target characteristic to:
- generate a first equalized signal,
- perform a delta sigma modulation process on the first equalized signal,
- generate a third digital signal having the predetermined sampling frequency and the quantization bit number a,
- expand the quantization bit number of the third digital signal from a to c, and
- output a fourth digital signal;

performing a second equalizing process on the input digital signal with a second target characteristic to:
- generate a second equalized signal,
- perform a delta sigma modulation process on the second equalized signal,
- generate a fifth digital signal having the predetermined sampling frequency and the quantization bit number a,
- expand the quantization bit number of the fifth digital signal from a to c, and
- output a sixth digital signal;

providing the input digital signal with a delay equivalent to processing delay to:
- generate a seventh digital signal;
- expand the quantization bit number of the seventh digital signal from a to c, and
- output an eighth digital signal;

adding the second digital signal and the fourth digital to generate a ninth digital signal;

passing the ninth digital signal through a digital filter provided with a predetermined filter characteristic and output a tenth digital signal having the predetermined sampling frequency and a quantization bit number b;

performing a delta sigma modulation process on the tenth digital signal to:
- generate an eleventh digital signal having the predetermined sampling frequency and the quantization bit number a,
- expand the quantization bit number of the eleventh digital signal from a to c, and
- output a twelfth digital signal; and adding the sixth digital signal, the eighth digital signal, and the twelfth digital signal.

* * * * *